(12) United States Patent
Walz et al.

(10) Patent No.: US 11,235,715 B2
(45) Date of Patent: Feb. 1, 2022

(54) TEST DEVICE FOR A PLUG-IN CONNECTION, CONTROL UNIT, CONTROL SYSTEM

(71) Applicant: Robert Bosch GmbH, Stuttgart (DE)

(72) Inventors: Stefan Walz, Schwaebisch Gmuend (DE); Nestor Mbogni, Sindelfingen (DE); Christoph Van Der Smissen, Holzgerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/756,107

(22) PCT Filed: Nov. 8, 2018

(86) PCT No.: PCT/EP2018/080618
§ 371 (c)(1),
(2) Date: Apr. 14, 2020

(87) PCT Pub. No.: WO2019/092106
PCT Pub. Date: May 16, 2019

(65) Prior Publication Data
US 2020/0282927 A1    Sep. 10, 2020

(30) Foreign Application Priority Data
Nov. 13, 2017    (DE) ............... 10 2017 220 142.8

(51) Int. Cl.
*G01R 31/66*    (2020.01)
*B60R 16/023*   (2006.01)
*G01R 31/00*    (2006.01)

(52) U.S. Cl.
CPC .......... *B60R 16/023* (2013.01); *G01R 31/006* (2013.01); *G01R 31/66* (2020.01)

(58) Field of Classification Search
CPC ............ G01R 31/66–69; G01R 31/006; B60R 16/023; B60R 16/0207–0222; H01R 13/6683
See application file for complete search history.

(56) References Cited

U.S. PATENT DOCUMENTS

| | | | |
|---|---|---|---|
| 5,719,552 A | * | 2/1998 | Thompson ............. B60Q 1/305 200/184 |
| 6,570,146 B1 | | 5/2003 | Emery et al. |

(Continued)

FOREIGN PATENT DOCUMENTS

| | | |
|---|---|---|
| CN | 101233418 A | 7/2008 |
| CN | 203050889 U * | 7/2013 |

(Continued)

OTHER PUBLICATIONS

International Search Report corresponding to PCT Application No. PCT/EP2018/080618, dated Jan. 28, 2019 (German and English language document) (6 pages).

*Primary Examiner* — Patrick Assouad
*Assistant Examiner* — Demetrius R Pretlow
(74) *Attorney, Agent, or Firm* — Maginot, Moore & Beck LLP

(57) ABSTRACT

A test device for a plug-in connection is configured to detect one or more of moisture and liquid in at least one protective chamber of the plug-in connection. The plug-in connection has a first plug part and a second plug part each with a plurality of electrically conductive contact elements. The first and second plug parts are configured to be plugged together such that at least some of the contact elements of the first plug part come into electrical contact with at least some contact elements of the second plug part. The first and second plug parts, when in the plugged-together state, form the at least one protective chamber, which is configured for (Continued)

the contact elements. In one embodiment, the plug-in connection is associated with a control unit of a steering system for a motor vehicle.

12 Claims, 2 Drawing Sheets

(56) References Cited

U.S. PATENT DOCUMENTS

| | | | |
|---|---|---|---|
| 7,544,082 B1 | 6/2009 | Halvorsen | |
| 9,823,286 B2 * | 11/2017 | Connell | G01R 31/00 |
| 2007/0032113 A1 * | 2/2007 | Takagi | H01R 13/6315 |
| | | | 439/246 |
| 2007/0209440 A1 * | 9/2007 | Dockendorff | B65D 85/00 |
| | | | 73/642 |
| 2012/0013471 A1 * | 1/2012 | Jones | G01K 7/00 |
| | | | 340/584 |
| 2013/0031976 A1 * | 2/2013 | Eckhardt | H01R 13/5808 |
| | | | 73/431 |
| 2013/0250340 A1 * | 9/2013 | Osawa | G03G 15/55 |
| | | | 358/1.14 |
| 2016/0082852 A1 * | 3/2016 | Kim | G01K 13/00 |
| | | | 307/125 |
| 2016/0313270 A1 * | 10/2016 | Connell | G01R 31/69 |
| 2018/0246158 A1 * | 8/2018 | Taylor | H01R 13/6683 |
| 2019/0079037 A1 * | 3/2019 | Jol | G01N 27/048 |

FOREIGN PATENT DOCUMENTS

| | | | | |
|---|---|---|---|---|
| CN | 204793398 U | | 11/2015 | |
| CN | 105785210 A | * | 7/2016 | |
| CN | 106129708 A | | 11/2016 | |
| CN | 206412538 U | | 8/2017 | |
| CN | 206490218 U | | 9/2017 | |
| DE | 4411137 A1 | * | 11/1995 | H01R 43/005 |
| DE | 100 26 968 A1 | | 12/2001 | |
| DE | 11 2015 005 612 T5 | | 9/2017 | |
| EP | 1 206 012 A2 | | 5/2002 | |
| JP | 2001-006822 A | | 1/2001 | |
| JP | 2003198149 A | * | 7/2003 | |
| JP | 3211232 U | | 6/2017 | |
| KR | 10-1454440 B1 | | 10/2014 | |
| WO | 2010/134974 A2 | | 11/2010 | |

* cited by examiner

TEST DEVICE FOR A PLUG-IN CONNECTION, CONTROL UNIT, CONTROL SYSTEM

This application is a 35 U.S.C. § 371 National Stage Application of PCT/EP2018/080618, filed on Nov. 8, 2018, which claims the benefit of priority to Serial No. DE 10 2017 220 142.8, filed on Nov. 13, 2017 in Germany, the disclosures of which are incorporated herein by reference in their entirety.

BACKGROUND

The disclosure relates to a test device for a plug-in connection, in particular of a control unit of a steering system for a motor vehicle, wherein the plug-in connection has a first plug connector part and a second plug connector part that in each case have multiple electrically-conductive contact elements and may be or are plugged together in such a manner that at least some of the contact elements of the first plug connector part come into electrical physical contact with at least some of the contact elements of the second plug connector part and wherein the plug connector parts in the plugged-together state form at least one protective chamber for the contact elements.

Furthermore, the disclosure relates to a control unit that has at least one plug connector part for providing a plug-in connection of this type, and a control system that is provided with a corresponding plug-in connection.

Test devices of the type mentioned in the introduction are not known in the prior art. In contrast, plug-in connections in control units are widely known, in particular in order to connect control units to external electrical devices. Thus, by way of example, the control unit of a steering system of a motor vehicle may be electrically connected by way of a plug-in connection to an electrical actuator and/or to a sensor device of the steering system, in order to operate and/or to monitor the steering system. It is ensured by way of the plug-in connection that the electrical contacts are protected against external influences, in particular against moisture or fluid with the result that it is not possible for short circuits to occur between adjacent contact elements. For this purpose, the two plug connector parts of the plug-in connection form a protective chamber within which the contact elements lie.

The object of the disclosure is to provide a test device for a plug-in connection of this type, by means of which the functionability of the plug-in connection and consequently of the control unit or of the control system may be assessed with the result that, by way of example in the event of a malfunction of the plug-in connection, emergency measures or safety measures may be initiated that on the one hand allow the motor vehicle to continue to operate in a safe manner or on the other hand render it possible to bring about a safety shut-down.

SUMMARY

The object forming the basis of the disclosure is achieved by way of a test device having the features of the disclosure. This has the advantage that it is possible in a simple manner to identify whether there is the risk of a short circuit within the plug-in connection. For this purpose, it is provided in accordance with the disclosure that at least one of the plug connector parts has a device for detecting moisture and/or fluid in the at least one protective chamber. In the most simplest case, the device is by way of example a fluid sensor, in particular a moisture sensor, which is arranged in the protective chamber and is connected or may be connected to the control unit in such a manner as to be able to transfer signals and/or energy. If moisture and/or fluid are detected within the protective chamber, then it is concluded that there is the risk of misinformation or of a short circuit in the plug-in connection. It is thus possible in a simple manner to initiate a safety measure or emergency measure.

In accordance with a preferred embodiment of the disclosure, it is provided that the device has an electrically conductive test contact element, in particular a test contact pin, which protrudes into the protective chamber and may be contacted in an electrical manner. The additional test contact element consequently represents a sensor element that monitors the moisture value or moisture state within the protective chamber.

It is preferred that the test contact element is arranged between a contact element, which is used to supply voltage, and a ground contact element of the one plug connector part in the protective chamber. For the event that moisture and/or fluid is/are present in the protective chamber, this forms an electrical conductor between the test contact element and the ground contact element, as a result of which it is possible to recognize a signal change which renders it possible in a simple manner to conclude the presence of moisture and/or fluid.

It is particularly preferred that an evaluation circuit is connected to the test contact element and said evaluation circuit has a controllable signal generating device and a signal detecting device and is embodied so as by means of the signal detecting device to detect a signal that is generated by the signal generating device, wherein the test contact is connected to the evaluation circuit in such a manner that the generated signal is influenced in the presence of moisture and/or fluid in the protective chamber. It is also provided that a signal is generated and detected, wherein the generated signal is influenced in the presence of moisture and/or fluid with the result that the signal detected is not an expected signal but rather is a different signal. Thus, it is possible in a simple manner to conclude the presence of moisture and/or fluid in the protective chamber. By way of the evaluation circuit, a type of fluid sensor, in particular a moisture sensor, is consequently realized in a particularly cost effective manner in the protective chamber, wherein it is not absolutely possible here to determine a specific moisture value but rather it is possible to recognize whether the moisture and/or fluid present in the protective chamber has exceeded a critical value to such an extent that the generated signal is influenced in such a manner that the detected signal recognizably deviates from the expected signal.

Furthermore, it is preferably provided that the signal generating device generates a pulse-width modulated signal that is transmitted to the test contact by way of a voltage divider. Thus, it is possible to detect or monitor the generated signal in a simple manner by way of the signal detecting device. It is then possible, especially in the absence of signal pulses, to identify in a simple manner that moisture or fluid are present in the protective chamber, which produces a shunt between the test contact and the ground contact.

In particular, the voltage divider has for this purpose two resistances that are connected in series between the signal generator and a semiconductor switch, the test contact being connected between said two resistances, wherein the semiconductor switch is connected on the one hand to a voltage supply and to the signal detecting device and on the other hand said semiconductor switch is connected to a ground connection. In the case of a sufficiently reduced electrical resistance between the test contact element and the ground contact element by way of the shunt, the signal that is generated by the signal generating device, in particular the pulse-width modulated signal, is influenced by the test contact and the shunt that is formed with respect to the ground contact element in such a manner that the semiconductor element is not switched on. It is therefore not possible to detect the voltage curve, which is monitored by the signal detecting device, of the voltage supply that is to be predetermined by the switching pattern of the signal generating device. If as a consequence, the supply voltage is not switched on, it is possible in a simple manner to conclude the presence of too much moisture and/or fluid in the protective chamber. The generated signal is in this case selected in such a manner that, in the absence of moisture and/or fluid in the protective chamber, the semiconductor switch is switched according to the pulse-width modulation, as a result of which a detectable supply voltage or a detectable supply voltage curve is produced.

It is particularly preferred that the semiconductor switch is embodied as a transistor. This may be used in a cost-effective manner and ensure a long serviceable life of the test device.

Furthermore, it is preferred that the signal detecting device is embodied so as to monitor the supply voltage for switching edges, said supply voltage being switched by the semiconductor, wherein in the presence of switching edges the signal detecting device identifies that a critical quantity of moisture and/or fluid is not present in the protective chamber and in the absence of switching edges said signal detecting device identifies that a critical quantity of moisture and/or fluid is present in the protective chamber. As already mentioned above, it is possible as a result in a simple manner to assess the moisture state in the protective chamber.

The control unit in accordance with the disclosure is characterized by the test device in accordance with the disclosure, said test device being allocated to the first plug connector part, in other words the plug connector part of the control unit. As a consequence, it is possible to realize the evaluation circuit in a particularly simple manner in the control unit and preferably for said evaluation circuit to be embodied in said control unit. It is particularly preferred that the control unit has multiple first plug connector parts that in each case have a test contact element. It is preferred that a dedicated evaluation circuit, as described above, is allocated to the respective test contact element. Alternatively, the test contact elements are electrically combined and allocated to a common evaluation circuit. It is then at least still possible to determine whether a critical quantity of fluid is present in one of the plug-in connections of the control unit, whereby it is not possible to determine in which of the plug-in connections.

The control system in accordance with the disclosure is characterized in that the test device or the control unit are embodied in accordance with the disclosure. The already mentioned advantages are thus produced.

BRIEF DESCRIPTION OF THE DRAWINGS

Further advantages and preferred features and feature combinations are disclosed in particular in the description above and also in the claims. The disclosure is to be further explained below with reference to the drawings. In the drawings:

DETAILED DESCRIPTION

Figure 1:
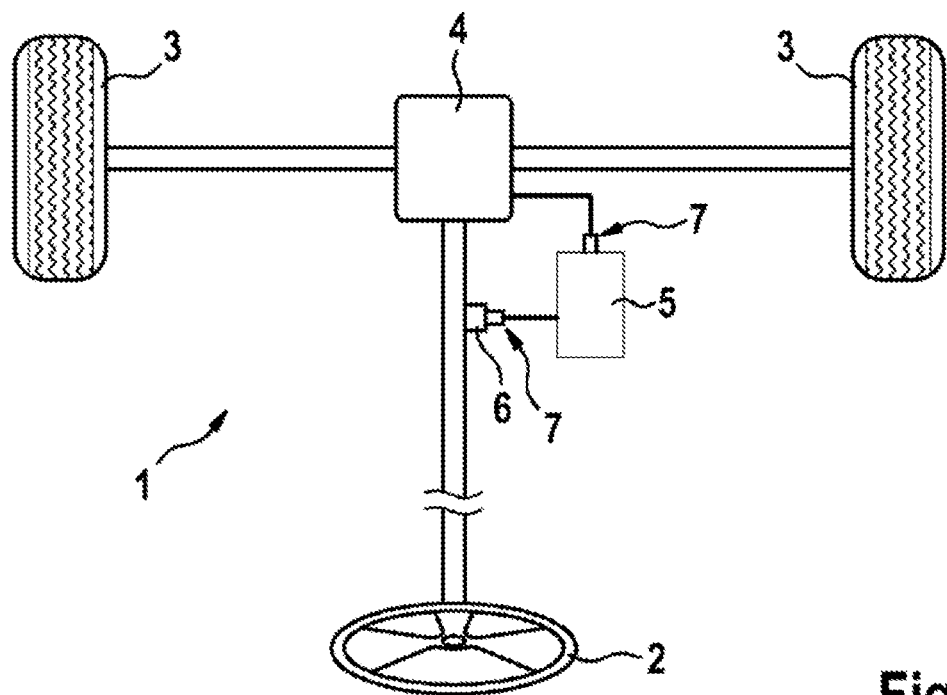
FIG. 1 illustrates a steering system in a simplified view.

FIG. 1 illustrates in a simplified view a steering system 1 of a motor vehicle, said steering system having a steering operating device 2, in particular a steering wheel, which is connected to two steerable wheels 3 of a motor vehicle with the aid of a power steering device 4. The power steering device 4 is connected to a control unit 5 that is connected in turn to a sensor 6 that is used to detect a steering movement of the steering operating device 2.

The control unit 5 that is illustrated in FIG. 1 without any spatial allocation is arranged by way of example directly in the power steering device 4, although for reasons of overview it is illustrated in FIG. 1 adjacent thereto.

The control unit 5 is connected in this case to the sensor 6 and to the power steering device 4 by way of plug-in connections 7.

Figure 2:
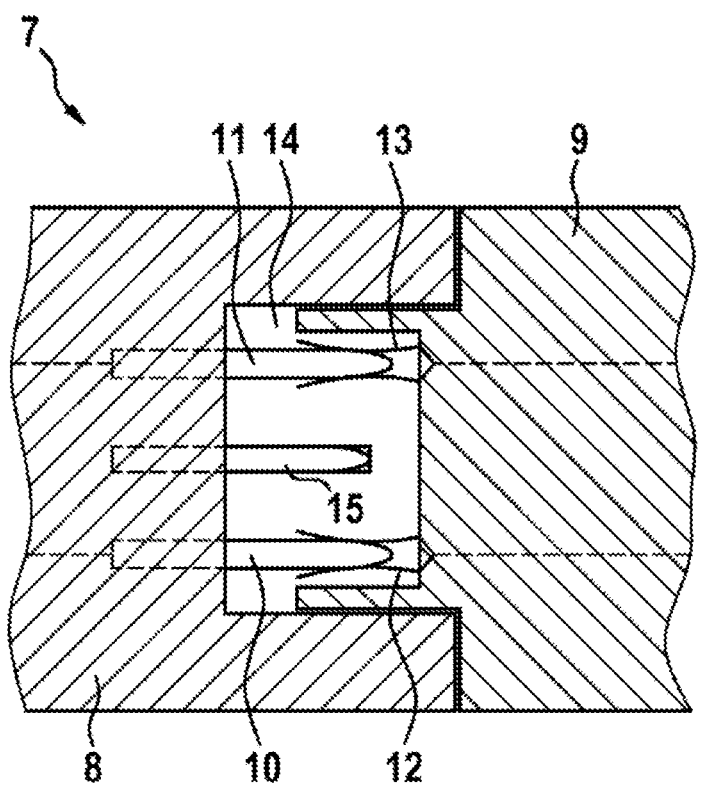
FIG. 2 illustrates a plug-in connection of the steering system in a simplified cross-sectional view and
FIG. 3 illustrates a test device of the steering system in a simplified circuit diagram.

FIG. 2 illustrates a plug-in connection 7 of this type in a simplified cross-sectional view. The respective plug-in connection 7 comprises a first plug connector part 8, which is allocated to the control unit 5, and a second plug connector part 9 that is allocated to the sensor 6 or to the power steering device 4 or is connected to said sensor or said power steering device directly. The plug connector parts 8, 9 are embodied so as to be plugged together and as a result to produce electrical physical contacts between electrical conductors of the control unit 5 and of the sensor 6 or of the power steering device 4. For this purpose, the first plug connector part 6 has multiple contact elements 10 and 11, wherein in the present case the contact element 10 is a ground connection plug connector element and the contact element 11 is a supply voltage contact element. The plug connector part 9 has likewise multiple contact elements 12, 13 that in the plugged-together state are in each case in physical contact with one of the contact elements 10, 11. For this purpose, it is provided in the present case that the contact elements 10 and 11 are embodied as contact pins and the contact elements 12, 13 are embodied as contact female connectors into which the contact pins may be inserted, as illustrated in FIG. 2.

In addition, the plug connector parts 8, 9 form in its last state a protective chamber 14 in which the contact elements 10 to 13 are arranged in such a manner as to be protected against external influences, in particular against fluids.

In addition, the plug connector part 8 is allocated a test contact element 15 that lies between the contact elements 11 and 10 in the protective chamber 14. The test contact element 15 is likewise embodied as a contact pin that thus protrudes into the protective chamber 14. The test contact element 15 is connected to an evaluation circuit by means of which in a simple manner it is possible to detect whether a fluid or alternatively moisture which could lead to a malfunction of the plug-in connection 7 is present in the protective chamber.

Figure 3:
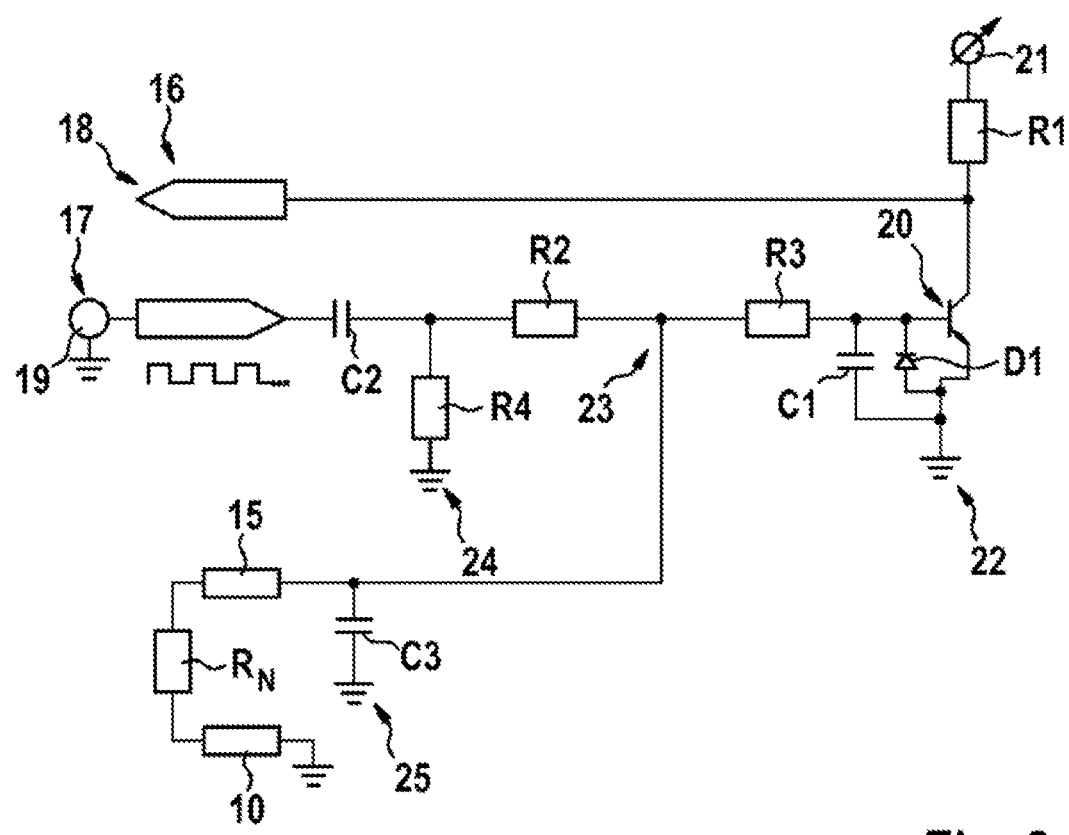

FIG. 3 illustrates for this purpose the advantageous evaluation circuit 16 that is advantageously realized in the control unit 5. The evaluation circuit 16 has a signal generating device 17 and a signal detecting device 18. The signal generating device 17 is embodied so as to generate a pulse-width modulated signal and for this purpose said signal generating device has a pulse-width signal generator 19.

The signal generating device 17 is connected to a semiconductor switch 20 that is actuated in response to the pulse-width modulated signal. In the actuated state, the semiconductor switch 20 connects a supply voltage source 21 to a ground connection 22. In so doing, a resistance R1 is connected between the supply voltage source 21 and the semiconductor 20. In addition, the signal detecting device 18 is connected between the resistance R1 and the semiconductor 20.

In the normal operation, it is therefore possible by way of the signal detecting device 18 to detect the supply voltage that is connected by way of the semiconductor switch 20 according to the switching curve. In the normal case, the detected signal would consequently correspond at last essentially to the generated signal.

The semiconductor switch 20 is in so doing embodied as a transistor that in addition is allocated a free-wheeling diode D1 and a capacitance C1 that is connected in parallel to the free-wheeling diode D1.

Two resistances R2 and R3 that are connected in series are arranged between the semiconductor switch 20 and the signal generating device 17, the test contact element 15 being connected between said two resistances. The test contact element 15 is consequently connected to the signal generating device 17 by way of a voltage divider 23.

In addition, a capacitance C2 is optionally connected upstream of the resistance R2, wherein optionally a ground connection 24 is connected between the capacitance C2 and the resistance R2 by way of a resistance R4.

The test contact element 15 is preferably connected to a ground connection 25 by way of a capacitance C3.

In the normal operation, the generated signal is not influenced by the connected test contact element 15 with the result that it is possible to switch the semiconductor switch 20 as previously explained and the procedure may be monitored by the signal detecting device 18. However, if water or any other fluid is present in the protective chamber 14, this thus produces a shunt to the adjacent contact element 10 that represents the ground connection, wherein this connection is illustrated in FIG. 3 by a variable resistance $R_N$ of the shunt. If the resistance is too small, the shunt is therefore almost a short circuit and this results in the generated signal being influenced in such a manner that the switching element 20 no longer switches with the result that consequently the signal detecting device 18 is also no longer able to identify a switching curve in the supply voltage. On the contrary, a constant voltage is ascertained.

It is preferred that the evaluation circuit 16 operates with alternating voltage and low voltages on the test contact element 15 in order to extensively exclude electrical corrosion as a result of the current flow at the test contact element 15. If the inverted signal is read back to the signal generating device 17 by the signal detecting device 18, it is subsequently identified that fluid is not present in the protective chamber 14. If on the other hand a constant voltage is detected, it is subsequently identified that water must be present in the protective chamber 14 or another conductive fluid must be present in the protective chamber 14. By virtue of the fact that the switching element 20 is not switched, it is no longer possible by way of the signal detecting device 18 to detect any switching edges. In accordance with a specific exemplary embodiment, it is possible to select the following values for the resistances and capacitances: R1=10 kΩ, R2=22.1 kΩ, R3=22.1 kΩ, R4=22.1 kΩ, C1=100 pF, C2=1 nF, C3=4.7 nF. It is possible by way of example to select as a supply voltage a (DVDD-)voltage of $U_v$=3.3V.

The invention claimed is:

1. A test device for a plug-in connection, the plug-in connection having first and second plug connector parts each with multiple electrically-conductive first and second contact elements, respectively, the first and second plug connector parts configured to be plugged together such that at least some of the first contact elements come into electrical physical contact with at least some of the second contact elements, the first and second plug connector parts in the plugged-together state defining at least one protective chamber configured for the first and second contact elements, the test device comprising:
   a device associated with at least one of the first and second plug connector parts and configured to detect one or more of moisture and fluid in the protective chamber, the device having an electrically-conductive test contact element that protrudes into the protective chamber and that is configured to be contacted in an electrical manner; and
   an evaluation circuit connected to the test contact element and having a controllable signal generating device and a signal detecting device, the evaluation circuit configured to detect with the signal detecting device a signal that is generated by the signal generating device,
   wherein
   the test contact element is connected to the evaluation circuit such that the generated signal is configured to be influenced in a recognizable manner by the signal detecting device in the presence of the one or more of moisture and fluid in the protective chamber, and
   the test contact element is arranged between a voltage supply contact element and a ground contact element of the at least one of the first and second plug connector parts in the protective chamber.

2. The test device as claimed in claim 1, wherein the signal generating device generates a pulse-width modulated signal that is transmitted to the test contact element by a voltage divider.

3. The test device as claimed in claim 2, wherein the voltage divider has two resistances that are connected in series between the signal generating device and a semiconductor switch, the test contact element connected between the two resistances, and wherein the semiconductor switch is connected (i) at a first connection to a voltage supply and to the signal detecting device and (ii) at a second connection to a ground connection.

4. The test device as claimed in claim 3, wherein the semiconductor switch is a transistor.

5. The test device as claimed in claim 3, wherein the signal detecting device is configured to monitor the voltage supply for switching edges, the voltage supply being switched by the semiconductor switch, and wherein (i) in the presence of the switching edges the signal detecting device identifies that a critical quantity of fluid is not present in the protective chamber and (ii) in the absence of the switching edges the signal detecting device identifies that the critical quantity of fluid is present in the protective chamber.

6. A control unit, comprising:
   at least one first plug connector part configured for a plug-in connection that includes the first plug connector part and a second connector part, the first and second plug connector parts each having multiple electrically-conductive contact elements and are configured to be plugged together such that at least some of the contact elements of the first plug connector part come into electrical physical contact with at least some of the contact elements of the second plug connector part, the first and second plug connector parts in the plugged-together state defining at least one protective chamber configured for the contact elements; and a test device allocated to the first plug connector part, the test device including:

a device configured to detect one or more of moisture and fluid in the protective chamber, the device having an electrically-conductive test contact element that protrudes into the protective chamber and that is configured to be contacted in an electrical manner, and an evaluation circuit connected to the test contact element and having a controllable signal generating device and a signal detecting device, the evaluation circuit configured to detect with the signal detecting device a signal that is generated by the signal generating device, wherein the test contact element is connected to the evaluation circuit such that the generated signal is configured to be influenced in a recognizable manner by the signal detecting device in the presence of the one or more of moisture and fluid in the protective chamber, and the test contact element is arranged between a voltage supply contact element and a ground contact element of the at least one of the first and second plug connector parts in the protective chamber.

7. The control unit as claimed in claim 6, wherein the evaluation circuit is configured in the control unit.

8. A control system, comprising:

at least one control unit;

at least one first device configured to be operated in an electrical manner and connected to the control unit via a plug-in connection, the plug-in connection having a first plug connector part and a second plug connector part that each have multiple electrically-conductive contact elements and that are configured to be plugged together such that at least some of the contact elements of the first plug connector part come into electrical physical contact with at least some of the contact elements of the second plug connector part, the first and second plug connector parts in the plugged-together state defining at least one protective chamber configured for the contact elements; and a test device associated with at least one of the first and second plug connector parts, the test device including:

a second device configured to detect one or more of moisture and fluid in the at least one protective chamber, the second device having an electrically-conductive test contact element that protrudes into the protective chamber and that is configured to be contacted in an electrical manner, and an evaluation circuit connected to the test contact element and having a controllable signal generating device and a signal detecting device, the evaluation circuit configured to detect with the signal detecting device a signal that is generated by the signal generating device, wherein the test contact element is connected to the evaluation circuit such that the generated signal is configured to be influenced in a recognizable manner by the signal detecting device in the presence of one or more of moisture and fluid in the protective chamber, and the test contact element is arranged between a voltage supply contact element and a ground contact element of the at least one of the first and second plug connector parts in the protective chamber.

9. The test device as claimed in claim 1, wherein the plug-in connection is associated with a control unit of a steering system for a motor vehicle.

10. The test device as claimed in claim 1, wherein the test contact element is configured as a test contact pin.

11. The control unit as claimed in claim 6, wherein the control unit is configured for a steering system of a motor vehicle.

12. The control system as claimed in claim 8, wherein the control system is configured as a steering system of a motor vehicle.

* * * * *